(12) United States Patent
Leobandung

(10) Patent No.: US 9,196,485 B2
(45) Date of Patent: Nov. 24, 2015

(54) STACKED SIDEWALL PATTERNING

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/188,883

(22) Filed: Feb. 25, 2014

(65) Prior Publication Data

US 2015/0243503 A1  Aug. 27, 2015

(51) Int. Cl.
| | |
|---|---|
| H01L 21/033 | (2006.01) |
| H01L 21/308 | (2006.01) |
| H01L 21/3213 | (2006.01) |
| H01L 21/28 | (2006.01) |
| H01L 21/8238 | (2006.01) |
| H01L 21/8234 | (2006.01) |

(52) U.S. Cl.
CPC ...... *H01L 21/0337* (2013.01); *H01L 21/28132* (2013.01); *H01L 21/3086* (2013.01); *H01L 21/32139* (2013.01); *H01L 21/823431* (2013.01); *H01L 21/823821* (2013.01)

(58) Field of Classification Search
None
See application file for complete search history.

(56) References Cited

U.S. PATENT DOCUMENTS

| | | | | |
|---|---|---|---|---|
| 5,328,810 | A * | 7/1994 | Lowrey et al. | 430/313 |
| 6,875,703 | B1 | 4/2005 | Furukawa et al. | |
| 8,956,808 | B2 * | 2/2015 | Schmid et al. | 430/323 |
| 8,975,129 | B1 * | 3/2015 | Shieh et al. | 438/199 |
| 2007/0099431 | A1 * | 5/2007 | Li | 438/735 |
| 2011/0065275 | A1 * | 3/2011 | Kim et al. | 438/666 |
| 2013/0134486 | A1 | 5/2013 | Licausi | |
| 2013/0196508 | A1 | 8/2013 | LiCausi | |
| 2014/0220782 | A1 * | 8/2014 | Seo | 438/703 |

* cited by examiner

*Primary Examiner* — Daniel Luke
(74) *Attorney, Agent, or Firm* — Scully, Scott, Murphy & Presser P.C.; Louis J. Percello, Esq.

(57) ABSTRACT

The present disclosure provides methods of forming patterning features in a semiconductor structure using a sidewall image transfer technique. The method includes first forming a plurality of sacrificial mandrels over a dielectric hard mask layer. Each sacrificial mandrel has a width greater than a minimum spacing between adjacent patterning features subsequently formed according to a circuit design. After forming a plurality of spacer material layer portions on sidewalls of the sacrificial mandrels, a plurality of filler material layer portions are formed adjacent the spacer material layer portions. The cycle of forming the spacer material layer portions and filler material layer portions may be repeated until spaces between sacrificial mandrels are completely filled. Removal of the sacrificial mandrels and the filler material layer portions provides patterning features.

18 Claims, 6 Drawing Sheets

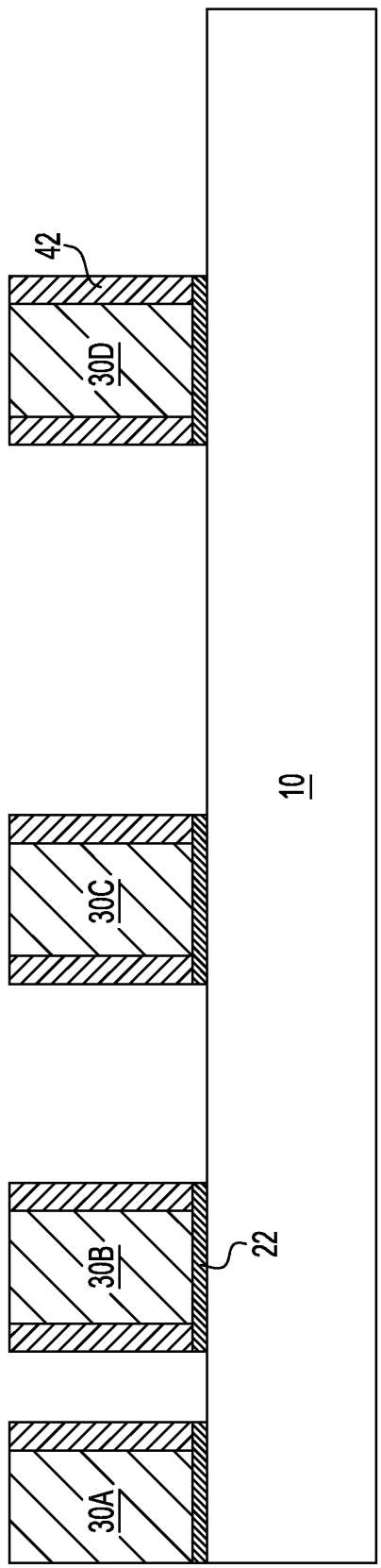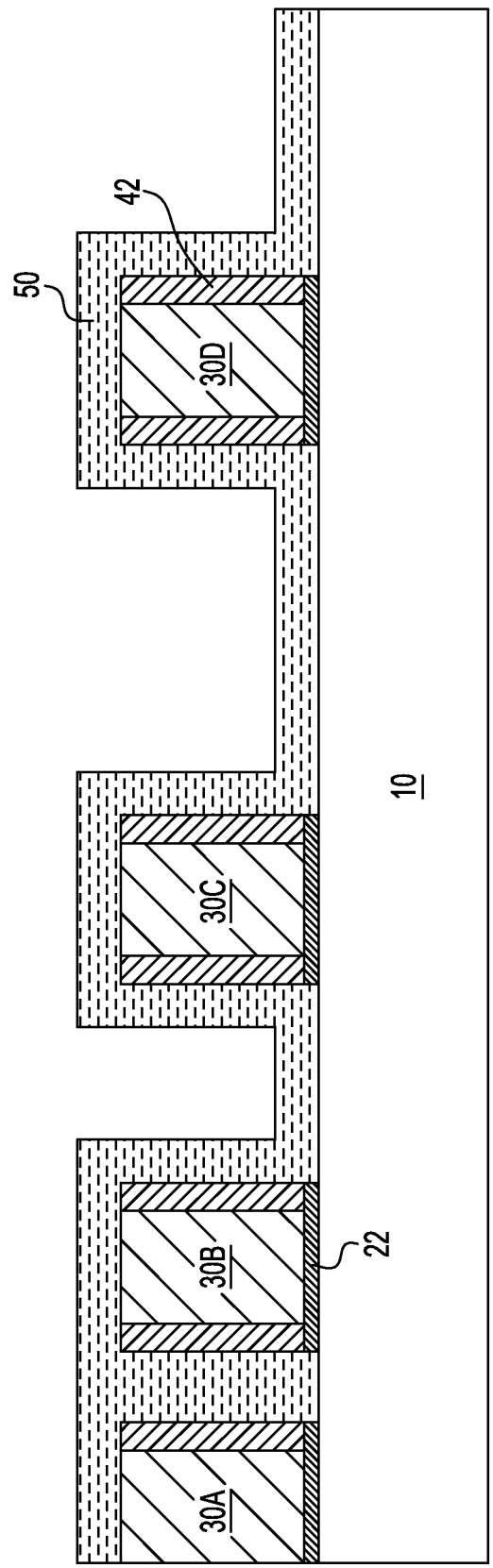

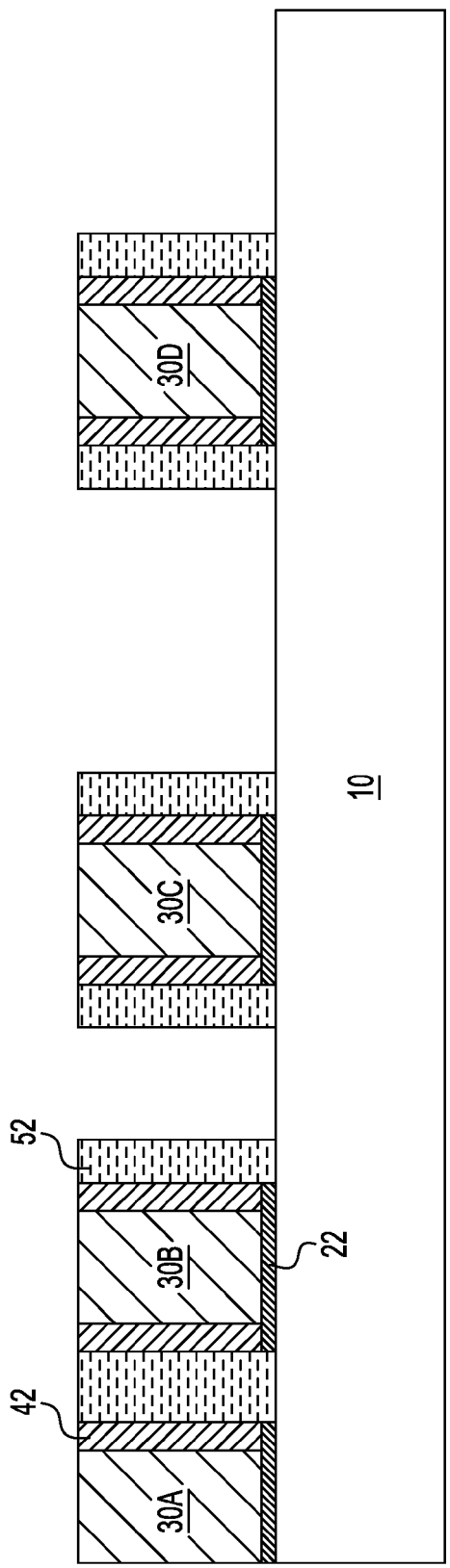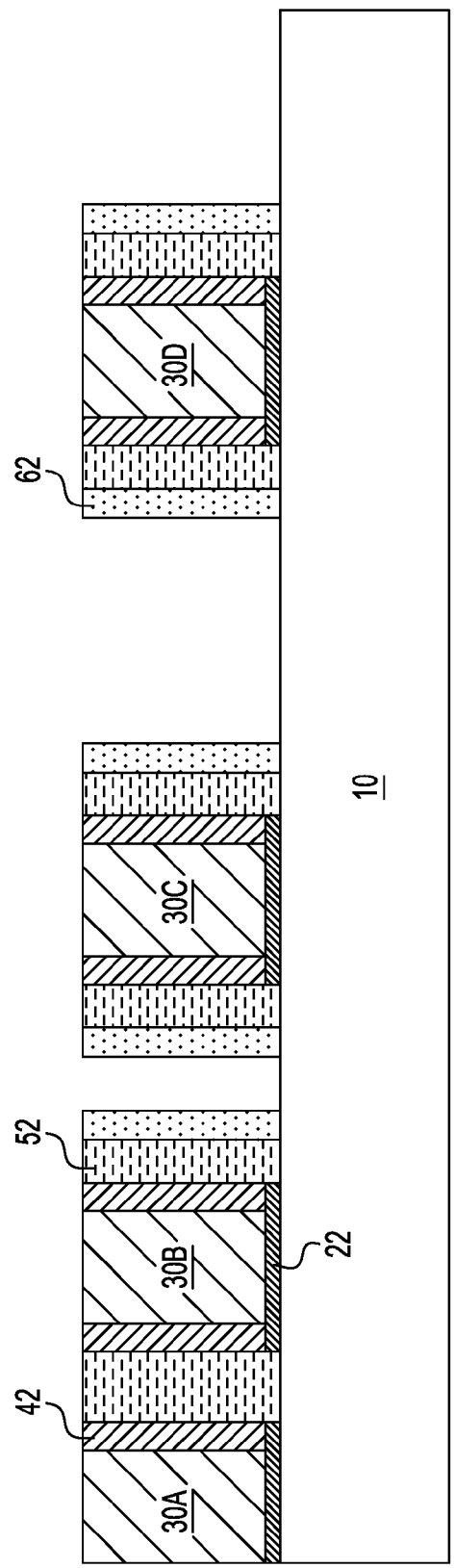

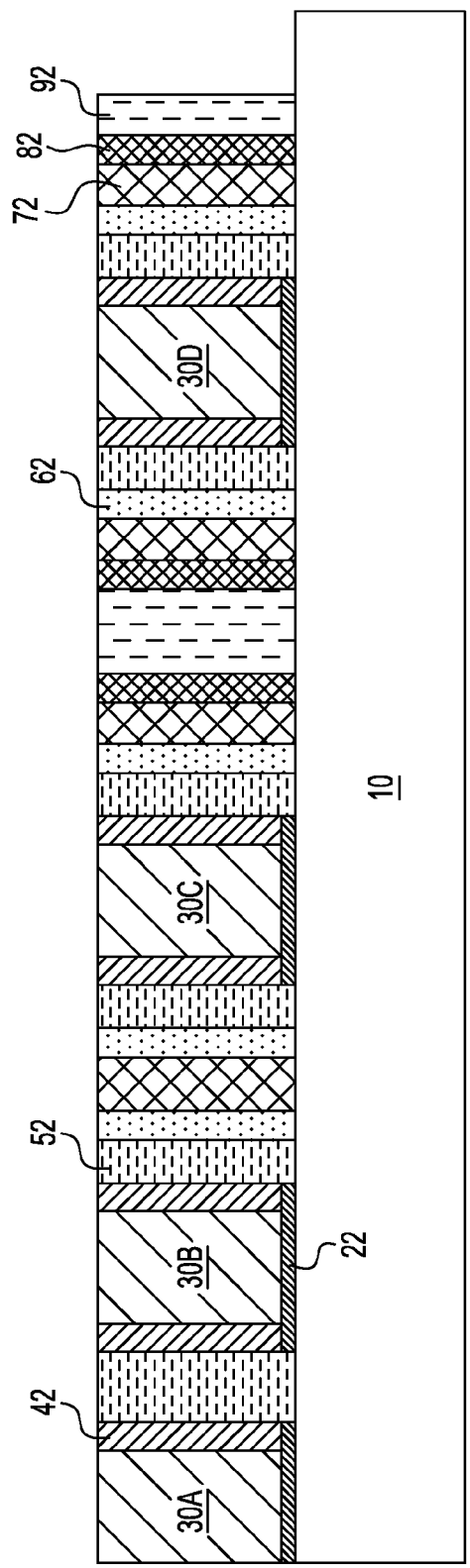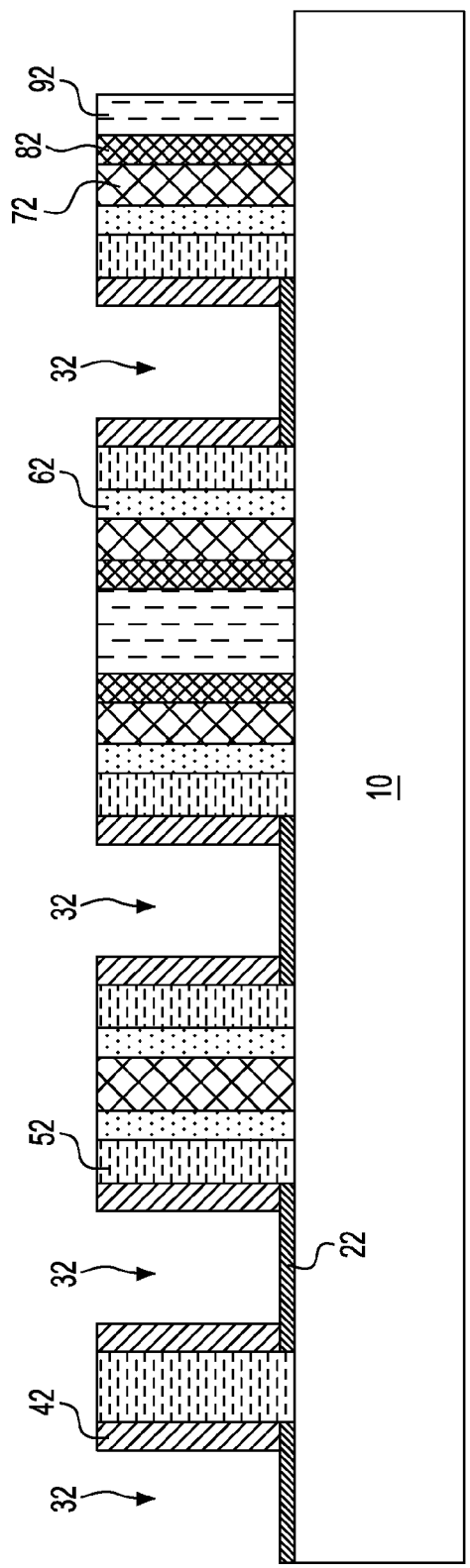

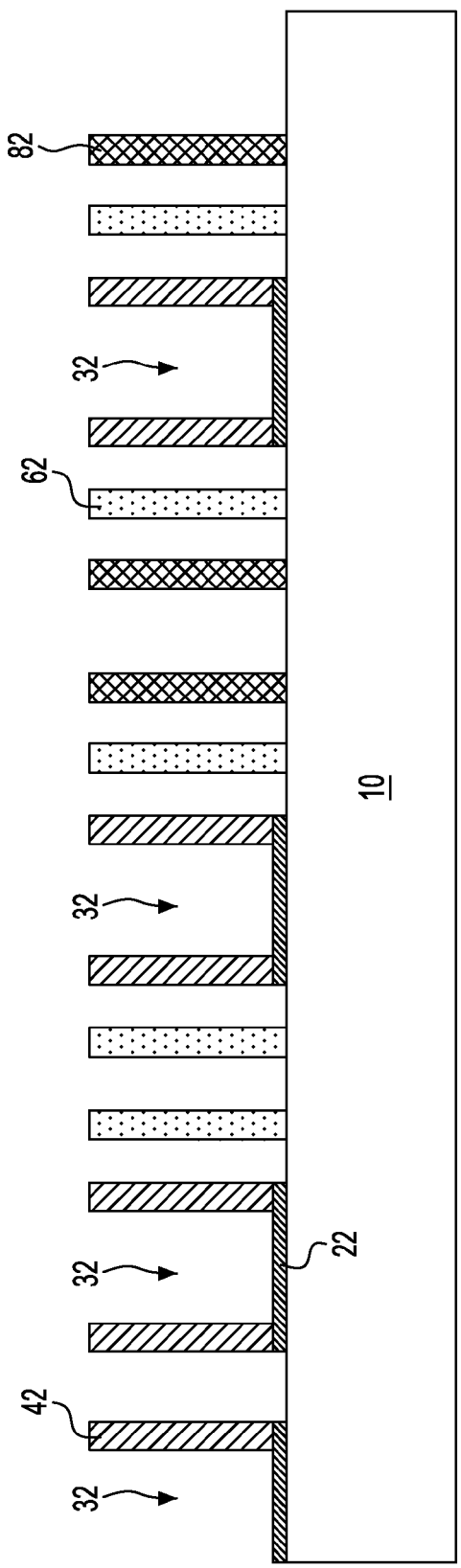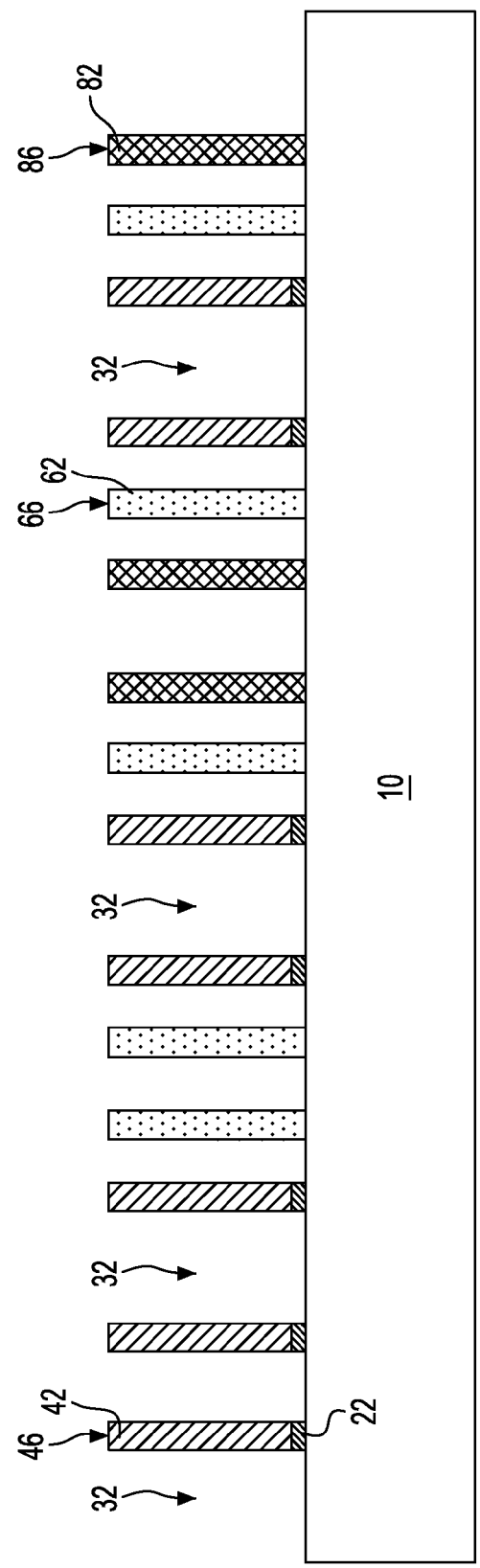

STACKED SIDEWALL PATTERNING

BACKGROUND

The present disclosure relates to semiconductor device fabrication. More particularly, the present disclosure relates to the fabrication of semiconductor devices using a sidewall image transfer (SIT) process.

Sidewall image transfer (SIT) is now commonly used to manufacture fins having pitches as small as 40 nm. SIT involves creating relief patterns, called mandrels and depositing sidewall spacers onto the mandrels. The mandrels are subsequently removed, thereby leaving behind sidewall spacers which can be used as an etch mask to transfer the pattern in the underlying stack. However, due to the continued trend to reduce feature sizes, the conventional SIT process faces some difficulties. For example, and because the spacing between the sidewall spacers is dependent upon the critical dimensions of the mandrels, SIT is very sensitive to mandrel uniformity and mandrel critical dimensions. Variations in the critical dimensions of mandrels increase as photolithography is pushed near its resolution limits to define the mandrels. As a result, the sidewall spacers can have a pitch that deviates from the pitch that is desired, thereby degrading the uniformity and ultimate quality of the integrated circuit patterned using the sidewall spacers. Moreover, closely spaced sidewall spacers also make removing unwanted sacrificial fins defined by SIT more difficult. As such, there remains a need to develop fabrication methods to overcome these difficulties.

SUMMARY

The present disclosure provides methods of forming patterning features in a semiconductor structure using a sidewall image transfer technique. The method includes first forming a plurality of sacrificial mandrels over a dielectric hard mask layer. Each sacrificial mandrel has a width greater than a minimum spacing between adjacent patterning features subsequently formed according to a circuit design. After forming a plurality of spacer material layer portions on sidewalls of the sacrificial mandrels, a plurality of filler material layer portions are formed adjacent the spacer material layer portions. This cycle of forming the spacer material layer portions and filler material layer portions may be repeated until spaces between sacrificial mandrels are completely filled. Removal of the sacrificial mandrels and the filler material layer portions provides patterning features. Because the spacing between adjacent patterning features is no longer determined by widths of sacrificial mandrels that are lithographically defined, but rather determined by side wall deposition, the spacing of the patterning features thus obtained can be precisely controlled by the thickness of each filler material layer. The spacing between adjacent sacrificial mandrels can also be controlled so that various number of patterning features can be formed in spaces between sacrificial mandrels. Furthermore, this methodology of the present disclosure, eliminates the need to remove sacrificial patterning features with a minimum spacing.

In one aspect of the present disclosure, a method of forming a semiconductor structure is provided. In one embodiment, the method of forming a semiconductor structure includes forming a plurality of sacrificial mandrels over a dielectric hard mask layer. Each sacrificial mandrel has a width greater than a minimum spacing between adjacent patterning features subsequently formed. A plurality of spacer material layer portions are then formed on sidewalls of the sacrificial mandrels. Next, a plurality of filler material layer portions are formed adjacent the spacer material layer portions. The filler material layer portions at least partially fill spaces between the sacrificial mandrels. The cycle of forming the spacer material layer portions and the filler material layer portions may be repeated until the spaces between the sacrificial mandrels are completely filled.

In another embodiment, the method of forming a semiconductor structure includes forming a dielectric hard mask layer over a semiconductor substrate. A plurality of sacrificial mandrels are then formed over the dielectric hard mask layer. Each sacrificial mandrel has a width greater than a minimum spacing between adjacent patterning features subsequently formed. After forming a plurality of first spacer material layer portions on sidewalls of the sacrificial mandrels, portions of the dielectric hard mask layer that are not covered by the sacrificial mandrels and the first spacer material layer portions are removed to provide dielectric hard mask layer portions. Next, a plurality of first filler material layer portions are formed adjacent the first spacer material layer portions and the dielectric hard mask layer portions. The first filler material layer portions have a thickness configured to completely fill a space between adjacent sacrificial mandrels having a first spacing. A plurality of second spacer material layer portions are then formed adjacent the first filler material layer portions. Next, a plurality of second filler material layer portions are formed adjacent the second spacer material layer portions. The second filler material layer portions have a thickness configured to completely fill a space between adjacent sacrificial mandrels having a second spacing. After forming a plurality of third spacer material layer portions adjacent the second filler material layer portions, a plurality of third filler material layer portions are formed adjacent the third spacer material layer portions. The third filler material layer portions have a thickness configured to completely fill a space between adjacent sacrificial mandrels having a third spacing. The sacrificial mandrels are removed to expose portions of the dielectric hard mask layer portions, followed by removing the first filler material layer portions, the second filler material layer portions and the third filler material layer portions. The exposed portions of the dielectric hard mask layer portions are then removed.

BRIEF DESCRIPTION OF THE DRAWINGS

FIG. 3 is a cross-sectional view of the exemplary semiconductor structure of FIG. 2 after forming a plurality of first spacer material layer portions.

FIG. 4 is a cross-sectional view of the exemplary semiconductor structure of FIG. 3 after forming a first filler material layer.

FIG. 5 is a cross-sectional view of the exemplary semiconductor structure of FIG. 4 after forming a plurality of first filler material layer portions.

FIG. 6 is a cross-sectional view of the exemplary semiconductor structure of FIG. 5 after forming a plurality of second spacer material layer portions.

FIG. 9 is a cross-sectional view of the exemplary semiconductor structure of FIG. 8 after forming a plurality of third filler material layer portions.

FIG. 10 is a cross-sectional view of the exemplary semiconductor structure of FIG. 9 after removing the sacrificial mandrels.

FIG. 11 is a cross-sectional view of the exemplary semiconductor structure of FIG. 10 after removing the first filler material layer portions, the second filler material layer portions and the third filler material layer portions.

FIG. 12 is a cross-sectional view of the exemplary semiconductor structure of FIG. 11 after removing exposed portions of the dielectric hard mask layer portions.

DETAILED DESCRIPTION

Figure 1:
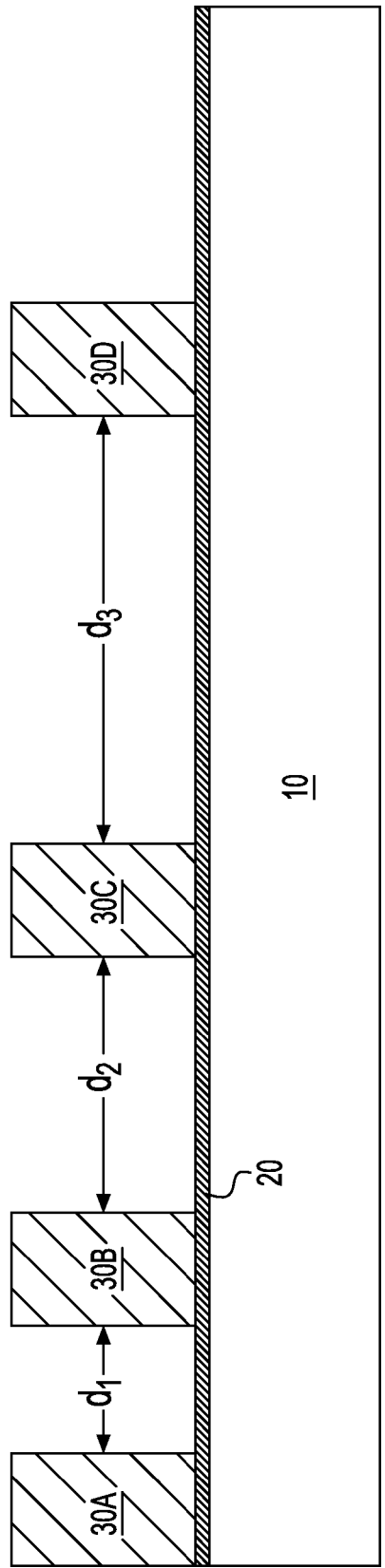
FIG. 1 is a cross-sectional view of an exemplary semiconductor structure including a semiconductor substrate, a dielectric hard mask layer and a plurality of sacrificial mandrels in accordance with an embodiment of present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Referring to FIG. 1, there is illustrated an exemplary semiconductor structure including, from bottom to top, a semiconductor substrate 10, a dielectric hard mask layer 20 and a plurality of sacrificial mandrels 30A-30D.

The semiconductor substrate 10 can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the semiconductor substrate 10. In one embodiment, the semiconductor substrate 10 comprises a single crystalline semiconductor material, such as, for example, single crystalline silicon. In other embodiments, the semiconductor substrate 10 may comprise a polycrystalline or amorphous semiconductor material.

In some embodiments of the present disclosure, the semiconductor substrate 10 can have a bulk configuration, in which a semiconductor material is throughout the entirety of the substrate. In other embodiments of the present disclosure, the semiconductor substrate 10 can be a silicon-on-insulator (SOI) substrate having a semiconductor material on top of a dielectric material.

The semiconductor substrate 10 can have a thickness sufficient to provide mechanical support to layers and/or structures to be subsequently formed thereupon. The thickness of the semiconductor substrate 10 can be from 50 µm to 2 mm, although lesser and greater thicknesses can also be employed.

The dielectric hard mask layer 20 is then formed on an uppermost surface of the semiconductor substrate 10. The dielectric hard mask layer 20 includes a dielectric material such as, for example, silicon oxide, silicon nitride, silicon oxynitride, a dielectric metal oxide, or a combination thereof.

In some embodiments of the present disclosure, the dielectric hard mask layer 20 can be formed, for example, by chemical vapor deposition (CVD) or atomic layer deposition (ALD). In other embodiments of the present disclosure, the dielectric hard mask layer 20 can be formed by thermal and/or plasma oxidation of, or thermal and/or plasma nitridation of, the underlying semiconductor material of the semiconductor substrate 10. The thickness of the dielectric hard mask layer 20 that is formed can be from 2 nm to 55 nm, although lesser and greater thicknesses can also be employed. In one embodiment of the present disclosure, the dielectric hard mask layer 20 includes silicon nitride deposited by CVD.

The sacrificial mandrels 30A-30D are formed over an uppermost surface of the dielectric hard mask layer 20. The sacrificial mandrels 30A-30D can be formed by first providing a blanket layer of mandrel-forming material (not shown). The mandrel-forming material can be, for example, a semiconductor material, a metallic material, or a dielectric material that is different from the dielectric material of the dielectric hard mask layer 20. Examples of the mandrel-forming material include, but are not limited to, polysilicon, amorphous silicon, a silicon germanium alloy, a silicon carbon alloy, a III-V semiconductor material, a II-VI semiconductor material, TaN, TiN, WN, and an organosilicate glass. The blanket layer of mandrel-forming material can be formed, for example, by CVD or plasma enhanced chemical vapor deposition (PECVD). The thickness of the blanket layer of mandrel-forming material can be from 50 nm to 1 µm, although lesser and greater thicknesses can also be employed.

After providing the blanket layer of mandrel-forming material, the blanket layer of mandrel-forming material can be patterned, for example, by applying a photoresist layer (not shown), lithographically patterning the photoresist layer, and transferring the pattern in the photoresist layer into the blanket layer of mandrel-forming material by an etch, which can be an anisotropic etch such as a reactive ion etch (RIE). The remaining portions of the blanket layer of mandrel-forming material constitute the sacrificial mandrels 30A-30D.

The sacrificial mandrels 30A-30D may have a trapezoidal shape or a rectangular shape in cross section. In one embodiment of the present disclosure, the sacrificial mandrels 30A-30D have a rectangular shape.

Since spacing between adjacent final patterning features of the present disclosure is not determined by the width of the sacrificial mandrels 30A-30B, but by the thickness of each filler material layer portions subsequently formed, the width of the sacrificial mandrels 30A-30B can be set to be greater than a desired spacing between adjacent patterning features formed by the SIT technique. The width of each of the sacrificial mandrel structures 30A-30D can be from 10 nm to 100 nm, although lesser and greater widths can also be employed. In the present disclosure, by forming relatively larger sacrificial mandrels 30A-30D thereby reducing the burdens on the resolution of the lithography system used to define sacrificial mandrels 30A-30D, the lithography system can advantageously be selected and set to maximize precision in sacrificial mandrels 30A-30D, rather than to form the smallest features possible.

In some embodiments of the present disclosure, the sacrificial mandrels 30A-30D are evenly spaced, i.e., having equal pitch. In other embodiments of the present disclosure and as shown in FIG. 1, the sacrificial mandrels 30A-30D are not evenly spaced, i.e., having multiple pitches. The spacing between adjacent sacrificial mandrels is determined by the number of final patterning features to be formed according to a circuit design. In one embodiment, a first spacing ($d_1$) between sacrificial mandrels 30A, 30B is smaller than a second spacing ($d_2$) between sacrificial mandrels 30B, 30C which is in turn is smaller than a third spacing ($d_3$) between sacrificial mandrels 30C, 30D, and the first spacing $d_1$, the second spacing $d_2$ and third spacing $d_3$ are configured such that two fins can be formed in the space between sacrificial mandrels 30A, 30B, four fins can be formed in the space between sacrificial mandrels 30B and 30C and six fins can be formed in the space between sacrificial mandrels 30C and 30D.

Figure 2:
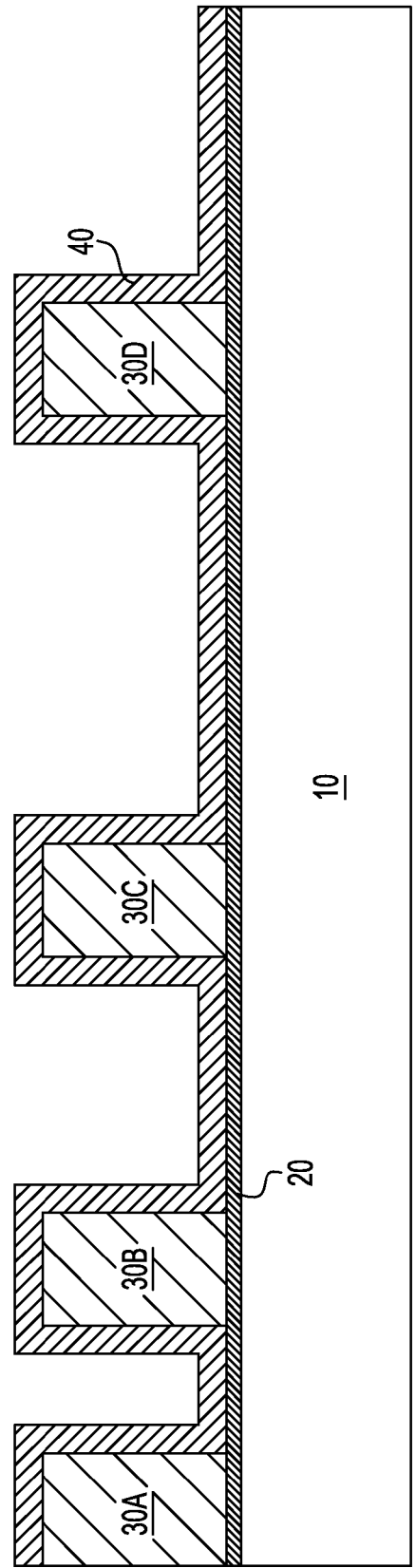
FIG. 2 is a cross-sectional view of the exemplary semiconductor structure of FIG. 1 after forming a first spacer material layer.

Referring to FIG. 2, there is illustrated the exemplary semiconductor structure of FIG. 1 after forming a first spacer material layer 40. The first spacer material layer 40 is conformally deposited over the sacrificial mandrels 30A-30D and the dielectric hard mask layer 20 by a conformal deposition process, such as, for example, CVD or ALD. The thickness of the first spacer material layer 40 may vary depending upon the desired width of the final patterning features to be formed in the semiconductor structure 10, and can be from 5 nm to 15 nm. In one embodiment of the present disclosure, the first spacer material layer 40 has a thickness of about 10 nm.

The first spacer material layer 40 can be composed of any dielectric material that is different from the material of the sacrificial mandrels 30A-30D, so that the sacrificial mandrels 30A-30D can be selectively removed with respect to the first spacer material. The first spacer material layer 40 can be comprised of an oxide such as silicon oxide or a nitride such as silicon nitride. The first spacer material layer 40 can be made of a same or different material as that used for the dielectric hard mask layer 20. In one embodiment and when the sacrificial mandrels 30A-30D are composed of amorphous silicon, the dielectric hard mask layer 20 and the first spacer material layer 40 are composed of silicon nitride.

Referring to FIG. 3, there is illustrated the exemplary semiconductor structure of FIG. 2 after forming a plurality of first spacer material layer portions 42. The first spacers material layer portions 42 are formed by removing horizontal portions of the first spacer material layer 40 by an anisotropic etching process, such as, for example, RIE. Remaining vertical portions of the first spacer material layer 40 that are present on sidewalls of sacrificial mandrels 30A-30D constitute first spacer material layer portions 42. The width of each first spacers material layer portions 42, as measured from its base, can be 5 nm to 15 nm, although lesser and greater widths can also be employed.

During removal of the horizontal portions of the first spacer material layer 40, portions of the dielectric hard mask layer 20 that are not covered by the sacrificial mandrels 30A-30D and the first spacer material layer portions 42 are also removed to expose portions of semiconductor substrate 10. The remaining portions of the dielectric hard mask layer 20 that are located beneath the sacrificial mandrels 30A-30D and the first spacer material layer portions 42 are herein referred to as dielectric hard mask layer portions 22.

Referring to FIG. 4, there is illustrated the exemplary semiconductor structure of FIG. 3 after forming a first filler material layer 50. The first filler material layer 50 is conformally deposited over the sacrificial mandrels 30A-30D, the first spacer material layer portions 42 and the exposed portions of semiconductor substrate 10 by a conformal deposition process, such as, for example, CVD or ALD. The thickness of the first filler material layer 50 may vary depending upon the desired spacing of the final patterning features to be formed in the semiconductor structure 10. As such, there is no need to remove patterning structures with a minimum spacing. The thickness of the first filler material layer 50 can be from 5 nm to 40 nm, although lesser and greater thicknesses can also be employed. In one embodiment of the present disclosure, the thickness of the first filler material layer 50 is selected such that the first filler material layer 50 completely fills a remaining space between the sacrificial mandrels 30A and 30B.

The first filler material layer 50 can be composed of any dielectric material that is different from the first spacer material, so that the first filler material layer 50 can be selectively removed with respect to the first spacer material layer portions 42. The first filler material can be an oxide such as silicon oxide or a nitride such as silicon nitride. In one embodiment and when the first spacer material is silicon nitride, the first filler material is silicon oxide.

Referring to FIG. 5, there is illustrated the exemplary semiconductor structure of FIG. 4 after forming a plurality of first filler material layer portions 52. The first filler material layer portions 52 are formed by removing horizontal portions of the first filler material layer 50 by an anisotropic etching process, such as RIE. Remaining vertical portions 52 of the first filler material layer 50 constitute first filler material layer portions 52.

This cycle of forming spacer material layer portions and filler material layer portions can be repeated as desired until the spaces between sacrificial mandrels 30B-30D are completely filled.

Referring to FIG. 6, there is illustrated the exemplary semiconductor structure of FIG. 5 after forming a plurality of second spacer material layer portions 62. The second spacer material layer portions 62 are provided by first forming a conformal second spacer material layer (not shown) over the sacrificial mandrels 30A-30D, the first spacer material layer portions 42, the first filler material layer portions 52 and the exposed portions of semiconductor substrate 10 employing a conformal deposition process, such as, for example, CVD or ALD. The thickness of the second spacer material layer may vary depending upon the desired width of final patterning features to be formed in the semiconductor structure, and can be from 5 nm to 10 nm. The thickness of the second spacer material layer can be the same as or different from the thickness of the first spacer material layer 40. In one embodiment of the present disclosure, the second spacer material layer has a thickness of about 10 nm, which is the same as that of the first spacer material layer 40.

The second spacer material layer can be composed of any dielectric material that is different from the first filler material, so that the first filler material layer portions 52 can be selectively removed with respect to the second spacer material layer portions to be subsequently formed. The second spacer material layer can be comprised of a same or different material as that of the first spacer material layer 40. In one embodiment, the second spacer material layer is composed of the same material as the first spacer material layer 40. For example, when the first filler material layer portions 52 is composed of silicon oxide, the first spacer material layer 40 and the second spacer material layer are composed of silicon nitride.

Horizontal portions of the second spacer material layer are then removed by an anisotropic etching process, such as, for example, RIE. The remaining vertical portions of the second spacer material layer constitute second spacer material layer portions 62. The width of each second spacer material layer portions 62, as measured from its base, can be 5 nm to 10 nm.

Figure 7:
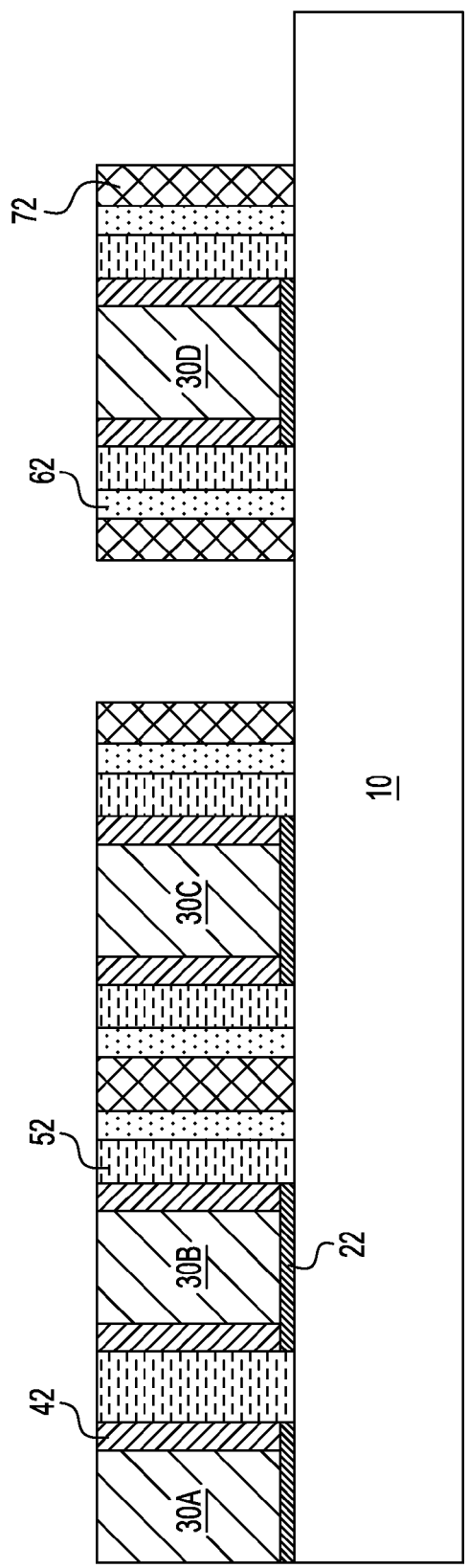
FIG. 7 is a cross-sectional view of the exemplary semiconductor structure of FIG. 6 after forming a plurality of second filler material layer portions.

Referring to FIG. 7, there is illustrated the exemplary semiconductor structure of FIG. 6 after forming a plurality of second filler material layer portions 72. The second filler material layer portions 72 can be provided by first forming a conformal second filler material layer (not shown) over the sacrificial mandrels 30A-30D, the first spacer material layer portions 42, the first filler material layer portions 52, the second spacer material layer portions 62 and the exposed portions of semiconductor substrate 10 by a conformal deposition process, such as, for example, CVD or ALD. The thickness of the second filler material layer can be from 5 nm to 40 nm, although lesser and greater thicknesses can also be employed. The thickness of the second filler material layer can be the same as or different from the thickness of the first filler material layer 50. In one embodiment of the present disclosure, the thickness of the second filler material layer is selected such that the second filler material layer fills a remaining space between the sacrificial mandrels 30B and 30C completely.

The second filler material layer can be composed of any dielectric material that is different from the first and the second spacer materials, so that the second filler material layer can be selectively removed with respect to the first spacer material layer portions 42 and the second spacer material layer portions 62. The second filler material layer may be made of a same or different material as that of the first filler material layer. In one embodiment of the present disclosure, the first and second filler material layers are composed of the same dielectric material, such as, for example, silicon oxide.

Horizontal portions of the second filler material layer are then removed by an anisotropic etching process, such as RIE. Remaining vertical portions of the second filler material layer constitute second filler material layer portions 72. The width of each second filler material layer portions 72, as measured from its base, can be from 5 nm to 40 nm.

Figure 8:
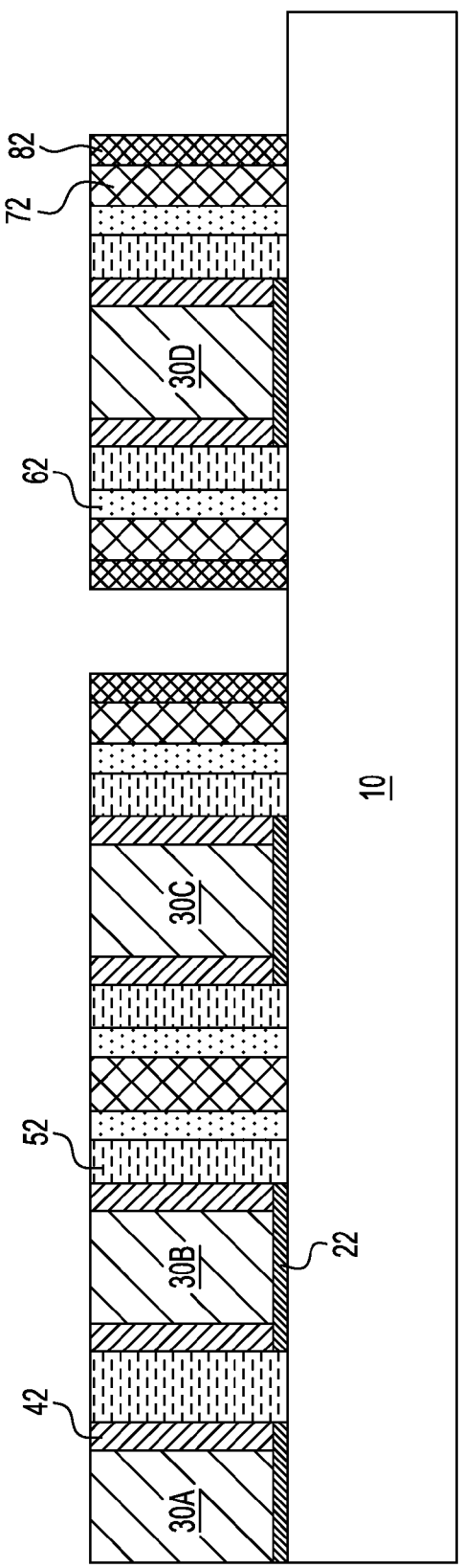
FIG. 8 is a cross-sectional view of the exemplary semiconductor structure of FIG. 7 after forming a plurality of third spacer material layer portions.

Referring to FIG. 8, there is illustrated the exemplary semiconductor structure of FIG. 7 after forming a plurality of third spacer material layer portions 82. The third spacer material layer portions 82 can be provided by first forming a conformal third spacer material layer (not shown) over the sacrificial mandrels 30A-30D, the first spacer material layer portions 42, the first filler material layer portions 52, the second spacer material layer portions 62, the second filler material layer portions 72 and the exposed portions of semiconductor substrate 10 by a conformal deposition process, such as, for example, CVD or ALD. The thickness of the third spacer material layer may vary depending upon the width of the final patterning features to be formed in the semiconductor structure, and can be from 5 nm to 10 nm. The thickness of the second spacer material layer can be the same as or different from the thickness of the first spacer material layer 40 and/or the thickness of the second spacer material layer. In one embodiment of the present disclosure, the third spacer material layer has a thickness of about 10 nm, which is the same as that of the first spacer material layer 40 and that of the second spacer material layer.

The third spacer material layer can be composed of any dielectric material that is different from the second filler material, so that the second filler material layer portions 72 can be selectively removed with respect to the third spacer material layer portions to be subsequently formed. The third spacer material layer can be comprised of a same or different material as that of the first spacer material layer 40 and/or that of the second spacer material layer. In one embodiment, the first, the second, the third spacer material layer are composed of the same material, such as, for example, silicon nitride.

Horizontal portions of the third spacer material layer are then removed by an anisotropic etching process, such as, for example, RIE. The remaining vertical portions of the third spacer material layer constitute third spacer material layer portions 82. The width of each third spacer material layer portions 82, as measured from its base, can be from 5 nm to 10 nm.

Referring to FIG. 9, there is illustrated the exemplary semiconductor structure of FIG. 8 after forming a plurality of third filler material layer portions 92. The third filler material layer portions 92 can be provided by first forming a conformal third filler material layer (not shown) over the sacrificial mandrels 30A-30D, the first spacer material layer portions 42, the first filler material layer portions 52, the second spacer material layer portions 62, the second filler material layer portions 72, the third spacer material layer portions 82 and the exposed portions semiconductor substrate 10 by a conformal deposition process, such as, for example, CVD or ALD. The thickness of the third filler material layer can be from 5 nm to 40 nm, although lesser and greater thicknesses can also be employed. The thickness of the third filler material layer can be the same as or different from the thickness of the first filler material layer 50 and/or the thickness of the second filler material layer. In one embodiment of the present disclosure, the thickness of the third filler material layer is selected such that the third filler material layer fills a remaining space between the sacrificial mandrels 30C and 30D completely.

The third filler material layer can be composed of any dielectric material that is different from the first, the second, and the third spacer materials, respectively, so that the third filler material layer portions that are subsequently formed can be selectively removed with respect to the first spacer material layer portions 42, the second spacer material layer portions 62 and the third spacer material layer portions 82. The third filler material layer may be made of a same or different material as that of the first filler material layer 50 and/or that of the second filler material layer. In one embodiment of the present disclosure, the third filler material layer is composed of silicon oxide, which is the same as the first filler material and the second filler material.

Horizontal portions of the third filler material layer are then removed by an anisotropic etching process, such as RIE. Remaining vertical portions of the third filler material layer constitute third filler material layer portions 92. The width of each third filler material layer portion 92, as measure from its base, can be from 5 nm to 40 nm.

Referring to FIG. 10, there is illustrated the exemplary semiconductor structure of FIG. 8 after removing the sacrificial mandrels 30A-30D. The sacrificial mandrels 30A-30D are removed selective to the first spacer material layer portions 42, the first filler material layer portions 52, the second spacer material layer portions 62, the second filler material layer portions 72, the third spacer material layer portions 82 and the third filler material layer portions 92 by an etch, which can be a wet etch or a dry etch. Removal of the sacrificial mandrels 30A-30D leaves openings 32 that are laterally surrounded by first spacer material layer portions 42. The openings 32 expose portions of the dielectric hard mask layer portions 22 that are located beneath the sacrificial mandrels 30A-30D.

Referring to FIG. 11, there is illustrated the exemplary semiconductor structure of FIG. 10 after removing the first filler material layer portions 52, the second filler material layer portions 72 and the third filler material layer portions 92. At least one etching process, either a wet etching or a dry etching is performed to selectively remove the first filler material layer portions 52, the second filler material layer portions 72 and the third filler material layer portions 92. In one embodiment of the present disclosure, when the first, the second and the third spacer material layer portions 42, 62, 82 and the dielectric hard mask layer portions 22 are composed of silicon nitride, and the first, the second and the third filler material layer portions 52, 72, 92 are composed of silicon oxide, the first, the second and the third filler material layer portions 52, 72, 92 can be removed by a hydrofluoric acid (HF) based etchant, such as, for example, buffered hydrofluoric acid (BHF), that doesn't substantially etch silicon nitride.

Referring to FIG. 12, there is illustrated the exemplary semiconductor structure of FIG. 11 after removing exposed portions of the dielectric hard mask layer portions 22 in the openings 32. The exposed portions of the dielectric hard mask layers portions 22 in the openings 32 can be removed by RIE. The remaining portions the dielectric hard mask layers portions 22 are herein referred to as dielectric hard mask spacers 26. Each dielectric hard mask spacer 26 and a corresponding overlying first spacer material layer portion 42 constitute a first sidewall spacer 46. Each second spacer material layer portion 62 constitutes a second sidewall spacer 66. Each third spacer material layer portion 82 constitutes a third sidewall spacer 86. The first sidewall spacers 46, the second sidewall spacers 66 and the third sidewall spacers 86 together define an etch mask that can be employed in defining various patterning features in the semiconductor substrate 10. For example, the first sidewall spacers 46, the second sidewall spacers 66 and the third sidewall spacers 86 can be used in defining semiconductor fins within semiconductor substrate 10. After defining the semiconductor fins, and removing the first sidewall spacers 46, the second sidewall spacers 66 and the third sidewall spacers 86, any conventional finFET processing flow may be used to form finFET devices.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a plurality of sacrificial mandrels over a dielectric hard mask layer, wherein each sacrificial mandrel has a width greater than a minimum spacing between adjacent patterning features subsequently formed according to a circuit design;
   forming a plurality of spacer material layer portions on sidewalls of the sacrificial mandrels;
   removing portions of the dielectric hard mask layer that are not covered by the sacrificial mandrels and the plurality of spacer material layer portions, wherein said removing the portions of the dielectric hard mask layer exposes portions of a semiconductor substrate on which the dielectric hard mask layer is disposed;
   conformally depositing a filler material layer over the sacrificial mandrels, the spacer material layer portions, and the exposed portions of the semiconductor substrate;
   forming a plurality of filler material layer portions adjacent the spacer material layer portions by removing horizontal portions of the filler material layer, said removing horizontal portions of the filler material layer exposing portions of the exposed portions the semiconductor substrate, wherein the filler material layer portions at least partially fill spaces between the sacrificial mandrels; and
   repeating said forming the spacer material layer portions and said forming the filler material layer portions until the spaces between the sacrificial mandrels are completely filled.

2. The method of claim 1, wherein said forming the plurality of sacrificial mandrels comprises:
   depositing a layer of mandrel-forming material on the dielectric hard mask layer; and
   patterning the layer of the mandrel-forming material to form the plurality of the sacrificial mandrels.

3. The method of claim 2, wherein the sacrificial mandrels have at least one spacing.

4. The method of claim 3, wherein the at least one spacing is determined by the number of the patterning features subsequently formed therein according to the circuit design.

5. The method of claim 1, wherein said forming the plurality of spacer material layer portions comprises:
   conformally depositing a spacer material layer over the sacrificial mandrels and the dielectric hard mask layer; and
   removing horizontal portions of the spacer material layer to provide the spacer material layer portions on sidewalls of the sacrificial mandrels.

6. The method of claim 1, further comprising:
   removing the sacrificial mandrels to expose portions of the dielectric hard mask layer portions that are located beneath the sacrificial mandrels;
   removing the filler material layer portions; and
   removing exposed portions of the dielectric hard mask layer portions.

7. The method of claim 6, further comprising performing at least one etching process using spacer material layer portions and remaining portions of the dielectric hard mask layer portions as an etch mask to define a plurality of patterning features in the semiconductor substrate.

8. The method of claim 7, wherein the patterning features comprises fins for a FinFET device.

9. The method of claim 1, wherein the sacrificial mandrels comprises amorphous silicon, polysilicon, a silicon germanium alloy, a silicon carbon alloy, a III-V semiconductor material, a II-VI semiconductor material, TaN, TiN, WN, or an organosilicate glass.

10. The method of claim 1, wherein the dielectric hard mask material layer and the spacer material portions comprise a same material.

11. The method of claim 10, wherein the dielectric hard mask material layer and the spacer material portions comprise silicon nitride.

12. The method of claim 1, wherein the filler material layer portions comprise silicon oxide.

13. The method of claim 1, wherein the spacer material portions have a width that is the same as or different from a width of the spacer material portions subsequently formed during said repeating said forming the spacer material layer portions.

14. The method of claim 1, wherein the filler material portions have a width that is the same as or different from a width of the filler material portions subsequently formed during said repeating said forming the filling material layer portions.

15. A method of forming a semiconductor structure comprising:
   forming a dielectric hard mask layer over a semiconductor substrate;
   forming a plurality of sacrificial mandrels over the dielectric hard mask layer, wherein each sacrificial mandrel has a width greater than a minimum spacing between adjacent patterning features subsequently formed according to a circuit design;

forming a plurality of first spacer material layer portions on sidewalls of the sacrificial mandrels;

removing portions of the dielectric hard mask layer that are not covered by the sacrificial mandrels and the first spacer material layer portions to provide dielectric hard mask layer portions;

forming a plurality of first filler material layer portions adjacent the first spacer material layer portions and the dielectric hard mask layer portions, the first filler material layer portions having a thickness configured to completely fill a space between adjacent sacrificial mandrels having a first spacing;

forming a plurality of second spacer material layer portions adjacent the first filler material layer portions;

forming a plurality of second filler material layer portions adjacent the second spacer material layer portions, the second filler material layer portions having a thickness configured to completely fill a space between adjacent sacrificial mandrels having a second spacing;

forming a plurality of third spacer material layer portions adjacent the second filler material layer portions;

forming a plurality of third filler material layer portions adjacent the third spacer material layer portions, the third filler material layer portions having a thickness configured to completely fill a space between adjacent sacrificial mandrels having a third spacing;

removing the sacrificial mandrels to expose portions of the dielectric hard mask layer portions;

removing the first filler material layer portions, the second filler material layer portions and the third filler material layer portions; and removing the exposed portions of the dielectric hard mask layer portions.

16. The method of claim 15, wherein each of the first spacer material layer portions and a corresponding remaining portion of the dielectric hard mask layer portions located beneath the first spacer material layer portions constitute a first sidewall spacer.

17. The method of claim 15, wherein the first spacer material layer portions, the second spacer material layer portions and the third spacer material layer portions have a same width.

18. The method of claim 15, wherein the first filler material layer portions, the second filler material layer portions, and the third filler material layer portions have a same width.

\* \* \* \* \*